United States Patent
Kobayashi (10) Patent No.: US 8,878,493 B2
(45) Date of Patent: Nov. 4, 2014

(54) APPARATUS FOR MONITORING OPERATION STATE OF BATTERY PACK COMPOSED OF PLURALITY OF CELLS MUTUALLY CONNECTED IN SERIES

(75) Inventor: Tetsuya Kobayashi, Anjo (JP)

(73) Assignee: Denso Corporation, Kariya (JP)

( * ) Notice: Subject to any disclaimer, the term of this patent is extended or adjusted under 35 U.S.C. 154(b) by 262 days.

(21) Appl. No.: 13/275,585

(22) Filed: Oct. 18, 2011

(65) Prior Publication Data
US 2012/0153961 A1 Jun. 21, 2012

(30) Foreign Application Priority Data
Oct. 18, 2010 (JP) ................................. 2010-233579

(51) Int. Cl.
| H02J 7/00 | (2006.01) |
| H01M 10/48 | (2006.01) |
| H01M 10/42 | (2006.01) |
| G01R 19/165 | (2006.01) |
| G01R 31/36 | (2006.01) |

(52) U.S. Cl.
CPC .............. *H01M 10/482* (2013.01); *Y02E 60/12* (2013.01); *Y02T 10/7055* (2013.01); *H01M 2010/4271* (2013.01); *G01R 19/16542* (2013.01); *H02J 7/0021* (2013.01); *G01R 31/3658* (2013.01); *H02J 7/0019* (2013.01); *G01R 31/362* (2013.01)
USPC ............ 320/118; 320/116; 320/119; 320/122

(58) Field of Classification Search
CPC ...................................................... H02J 7/0016

USPC ........................................................... 320/118
See application file for complete search history.

(56) References Cited

U.S. PATENT DOCUMENTS

| 6,020,718 A | 2/2000 | Ozawa et al. |
| 2005/0212482 A1* | 9/2005 | Nakada .......................... 320/120 |
| 2006/0022639 A1* | 2/2006 | Moore ............................ 320/116 |
| 2006/0103351 A1* | 5/2006 | Tanigawa et al. .............. 320/118 |
| 2010/0327809 A1* | 12/2010 | Takaoka et al. ................ 320/118 |

FOREIGN PATENT DOCUMENTS

| JP | H10-021965 | 1/1998 |
| JP | H10-023674 | 1/1998 |
| JP | P2001-025173 A | 1/2001 |
| JP | 2002-042906 | 2/2002 |
| JP | 2002-272011 | 9/2002 |
| JP | 2010-035337 | 2/2010 |
| WO | PCT/JP2008/053664 | * 8/2010 ................ H02J 7/04 |

OTHER PUBLICATIONS

Japanese Official Action dated Sep. 11, 2012 issued in corresponding Japanese Application No. 2010-233579, with English translation.

\* cited by examiner

*Primary Examiner* — Edward Tso
*Assistant Examiner* — Ahmed Omar
(74) *Attorney, Agent, or Firm* — Nixon & Vanderhye P.C.

(57) ABSTRACT

An apparatus is provided, which monitors an operation state of a battery composed of a plurality of cells mutually connected in series. In this apparatus, a cell voltage of each of the plurality of cells is detected as information indicating an operation state of the battery. Based on the detected cell voltages, an operation state is monitored for a cell having a highest cell voltage and a cell having a lowest cell voltage among the plurality of cells.

13 Claims, 6 Drawing Sheets

APPARATUS FOR MONITORING OPERATION STATE OF BATTERY PACK COMPOSED OF PLURALITY OF CELLS MUTUALLY CONNECTED IN SERIES

CROSS REFERENCE TO RELATED APPLICATIONS

This application is based on and claims the benefit of priority from earlier Japanese Patent Application No. 2010-233579 filed Oct. 18, 2010, the description of which is incorporated herein by reference.

BACKGROUND OF THE INVENTION

1. Technical Field

The present invention relates to an apparatus for monitoring an operation state of a battery pack composed of a plurality of cells which are mutually connected in series, and in particular to an apparatus for monitoring an operation state of a battery pack by detecting the voltage of the plurality of cells.

2. Related Art

Recently, battery packs, as represented by lithium batteries, having a plurality of cells mutually connected in series are more frequently used. Usually, such a battery pack is used in combination with an apparatus for monitoring an operation state (e.g., presence/absence of a failure) of the plurality of cells (hereinafter referred to as "battery-state monitoring apparatus"). The information used for monitoring the operation state of the battery pack includes voltage (called "cell voltage") information. Thus, depending on the way of detecting the cell voltages, battery-state monitoring apparatuses using different methods are available. As generally known, these methods include a method based on comparators or a method based on total-cell-voltage detection.

For example, the method based on comparators is suggested by a published patent document JP-A-H10-023674. This patent document describes an apparatus in which each of a plurality of cells connected in series is provided with a comparator. In each of the comparators, it is determined whether or not the corresponding cell voltage is higher (lower) than a predetermined voltage. Thus, overvoltage (low voltage) of the cell is detected. In this apparatus, the outputs of the comparators are ORed to detect a state where a failure has occurred in any one of the cells. This patent document suggests a method in which, if a failure occurs, the individual cells are disconnected from other devices.

According to the method based on total-cell-voltage detection, a cell voltage of each cell is detected, and the state of each cell is monitored based on the detected voltage itself. Since the cell voltages of the cells are detected one by one in the method based on total-cell voltage detection, the method enables highly accurate cell voltage detection and precise cell voltage management.

The method based on comparators as described in the above patent document enables constant high-speed detection of a failure of a cell. However, since the outputs of the comparators are ORed, there is a problem that the cell having a failure cannot be located.

In the method based on total-cell-voltage detection, the cell voltage of each cell can be detected with high accuracy and thus the cell having a failure can be located. However, the cell voltages of the individual cells have to be detected every time monitoring is carried out. Thus, it takes a long time before all of the cell voltages are detected. Therefore, this causes overshoot in which a cell voltage exceeds a predetermined value, or causes undershoot in which a cell voltage is below the predetermined value, raising a problem such as of affecting the life of the cells.

SUMMARY

Therefore, it is desired to provide a battery-state monitoring apparatus which enables high-speed monitoring of a plurality of cells with good accuracy in spite of the use of the method based on total-cell-voltage detection.

According to one typical embodiment, a battery-state monitoring apparatus is provided, which apparatus detects cell voltages of a plurality of cells connected in series and monitors a state of each of the plurality of cells based on the detected corresponding cell voltage. The apparatus includes a monitoring means for monitoring the operation state of a cell having a highest cell voltage and a cell having a lowest cell voltage among the plurality of cells.

Thus, cells targeted for monitoring are limited to two cells, i.e. the cell having the highest cell voltage and the cell having the lowest cell voltage. Therefore, it is not required to constantly monitor all of the cells. Accordingly, the number of cells targeted for monitoring is decreased and thus the cells targeted for monitoring can be monitored faster. Further, since a method of detecting the cell voltages of the cells targeted for monitoring is used, the cells are monitored with good accuracy. Accordingly, the cells in question are monitored faster with good accuracy.

Preferably, a configuration may include a plurality of comparators provided for a respective plurality of cells, each of the comparators comparing a cell voltage of the corresponding cell with a predetermined threshold.

More preferably, each of the plurality of comparators compares a cell voltage of the corresponding cell among the plurality of cells with a predetermined threshold to detect a cell having a highest cell voltage and a cell having a lowest cell voltage from among the plurality of cells.

Thus, use of the plurality of comparators enables concurrent diagnosis of the cell voltages of the respective cells. Further, owing to the concurrent diagnosis of the cells, the cells can be diagnosed faster.

In addition, it is preferable that the predetermined threshold is set to a value that falls within a normally used voltage range of the plurality of cells. Thus, since the predetermined threshold is set to a value that falls within a normally used voltage range of the cells, the cell voltages of the cells can be adapted to cross the predetermined threshold.

Further, two or more values may be provided as a predetermined threshold. Thus, the predetermined threshold may be set to an upper limit or a lower limit of the cell voltages, or set to a value to which attention is required to be paid.

On the other hand, a single value may be provided as a predetermined threshold. Thus, a configuration may be provided only for detecting cells each having a cell voltage exceeding or below the predetermined threshold. Thus, the configuration of the battery-state monitoring apparatus can be simplified.

Further, the apparatus may include a cell-number generation circuit which defines a cell having a highest cell voltage or a cell having a lowest cell voltage from among the plurality of cells, based on the outputs from the plurality of comparators, and then outputs data including information for locating the defined cells to the monitoring means. Thus, the frequency of interrupt with detection results from the cell-number generation circuit to the monitoring means is reduced. Accordingly, the processing load of the monitoring means is mitigated.

Furthermore, the monitoring means may be configured to perform charge or discharge of a predetermined amount for the plurality of cells and then to start monitoring of the plurality of cells. Thus, each of the cells may have a value equal to or more than the predetermined threshold or a value equal to or less than the predetermined threshold. Accordingly, each of the cells can be reliably diagnosed.

Also, the monitoring means may be configured to monitor a cell having a highest internal resistance among the plurality of cells. Accordingly, the apparatus is not only able to monitor each cell as to whether the cell voltage is high or low, but also able to carry out monitoring by locating a cell having a probability of being suffering from deterioration.

According to another typical embodiment, a battery-state monitoring apparatus is provided, which apparatus detects cell voltages of a plurality of cells connected in series and monitors a state of each of the plurality of cells based on the detected corresponding cell voltage. The apparatus includes a monitoring means for monitoring a cell having a highest internal resistance among the plurality of cells. Thus, cell voltages are used for restricting the cells to a cell having a probability of being suffering from deterioration. In this way, each of the cells can be monitored faster with good accuracy.

DETAILED DESCRIPTION OF PREFERRED EMBODIMENTS

With reference to the accompanying drawings, hereinafter are described several embodiments of a battery-state monitoring apparatus according to the present invention.

First Embodiment

Referring to some drawings, hereinafter, a first embodiment of the present invention is described.

Figure 1:
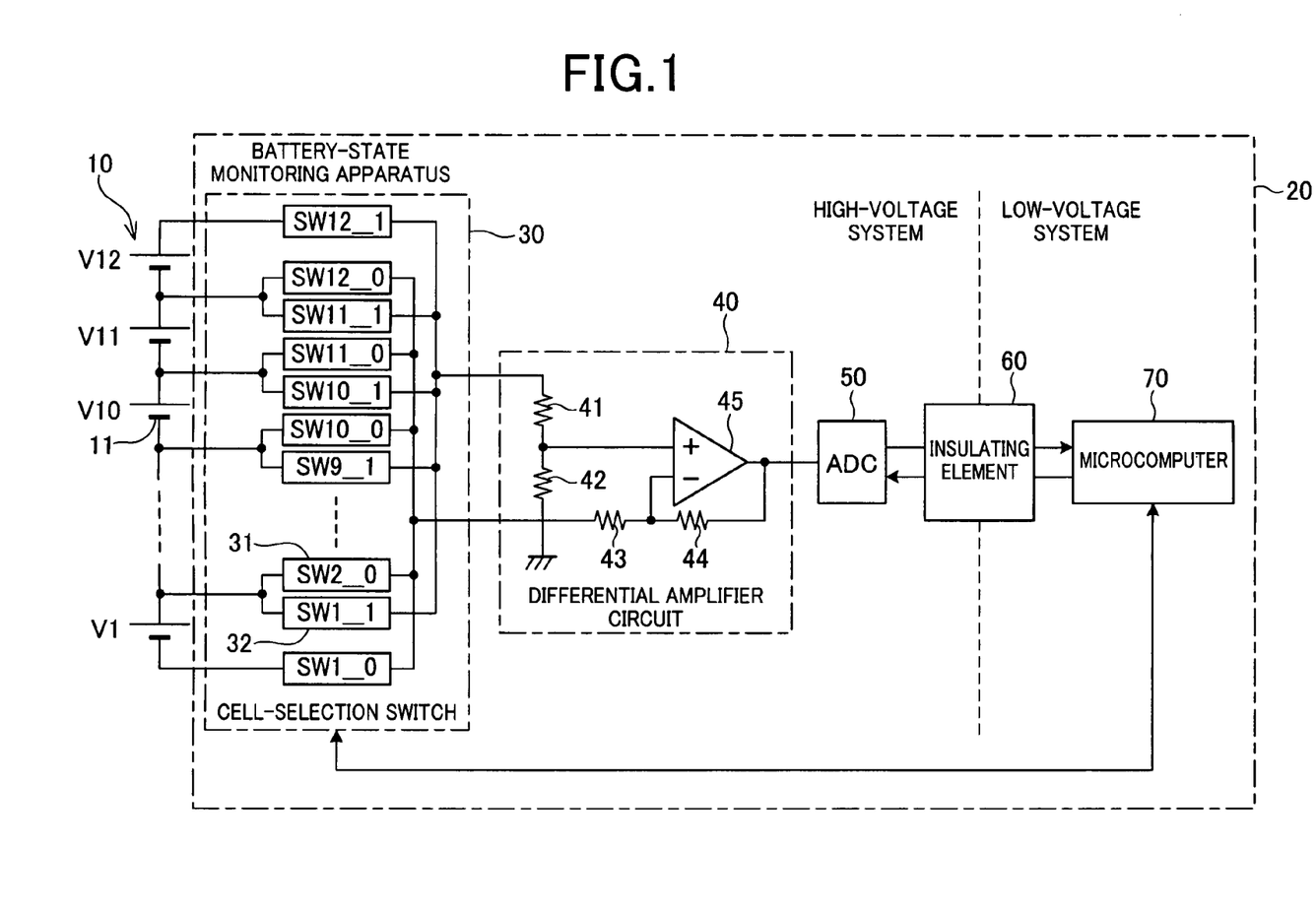
FIG. 1 is a schematic diagram illustrating a general configuration of a battery-state monitoring system including a battery-state monitoring apparatus according to a first embodiment and a fifth embodiment of the present invention.

FIG. 1 is a schematic diagram illustrating a general configuration of a battery-state monitoring system that includes a battery-state monitoring apparatus according to the present invention. As shown in the figure, the battery-state monitoring system includes a battery pack 10 and a battery-state monitoring apparatus 20.

The term "battery state" used here, the term is defined as "an operation state inside the battery pack 10" as to whether the battery is in a state of normally supplying predetermined electric power. The voltage (cell voltage) of each of the cells is checked to obtain a piece of information regarding the operation state.

The battery pack 10 is a group of cells composed of a plurality of minimum-unit cells 11 connected in series. For example, twelve cells 11 (V1 to V12) are connected in series. Rechargeable lithium ion secondary cells are used as the cells 11. The battery-state monitoring apparatus 20 is applied, for example, to an electric car, such as a hybrid car, and thus the battery pack 10 is installed in an electric car, such as a hybrid car, for use, for example, as a power supply for driving loads, such as an inverter and a motor, or a power supply for electronic devices.

The battery-state monitoring apparatus 20 serves as an apparatus for individually monitoring the operation states of the respective plurality of cells 11 composing the battery pack 10. Such a battery-state monitoring apparatus 20 includes a cell-selection switch 30, differential amplifier circuit 40, A/D converter 50 (ADC of FIG. 1), insulating element 60 and microcomputer 70. The microcomputer 70 functions as a monitoring means.

The cell-selection switch 30 is a group of switches which connect any of the cells 11 of the battery pack 10 to the differential amplifier circuit 40. Thus, the cell-selection switch 30 includes a plurality of negative-side switches 31 (SW1_0 to SW12_0) connected to a negative side of the respective cells 11 and a plurality of positive-side switches 32 (SW1_1 to SW12_1) connected to a positive side of the respective cells 11.

One terminal of each positive-side switch 32 and one terminal of each negative-side switch 31 are connected to a connecting point between one cell 11 and another cell 11. The positive-side switch 32 (SW12_1) is connected to the positive side of the cell 11 having a highest voltage. The negative-side switch 31 (SW1_0) is connected to the negative side of the cell 11 having a lowest voltage. The other terminal of each positive-side switch 32 and the other terminal of each negative-side switch 31 are connected to the differential amplifier circuit 40.

On/off control of the positive-side switches 32 and the negative-side switches 31 is performed by the microcomputer 70. In this way, cell voltages of specific cells 11 and a voltage of a block of a predetermined number of cells 11 are ensured to be inputted to the differential amplifier circuit 40. Each of the positive-side switches 32 and the negative-side switches 31 is made up, for example, of a transistor or the like.

The differential amplifier circuit 40 serves as a circuit that amplifies the cell voltages of the cells 11 selected by the cell-selection switch 30. The differential amplifier circuit 40 is composed of resistors 41 to 44 and an operational amplifier 45.

The resistor 41 is connected to the positive-side switches 32 of the cell-selection switch 30 and the resistor 42 is connected between the resistor 41 and the ground. A connecting point of the resistors 41 and 42 is connected to a non-inverting input terminal of the operational amplifier 45. The resistor 43 is connected to the negative-side switches 31 of the cell-selected switch 30 and the resistor 44 is connected between the resistor 43 and an output terminal of the operational amplifier 45. A connecting point of the resistors 43 and 44 is connected to an inverting input terminal of the operational amplifier 45. The output terminal of the operational amplifier 45 is connected to the A/D converter 50.

The A/D converter 50 serves as a circuit that measures a cell voltage of a cell 11 amplified by the differential amplifier circuit 40, in accordance with an instruction from the microcomputer 70. The A/D converter 50 converts the measured cell voltage into a digital signal and outputs the converted digital signal to the microcomputer 70. Thus, the microcomputer 70 carries out processing based on the cell voltage of the cell 11. For example, the microcomputer 70 carries out digital processing to detect the failure of a cell 11 or to locate the cell 11 having a failure.

The insulating element 60 serves as an element that insulates a high-voltage system composed such as of the cell-selection switch 30, the differential amplifier circuit 40 and the A/D converter 50 from a low-voltage system composed such as of the microcomputer 70. Signals are transmitted/received to/from the microcomputer 70 and the A/D converter 50 via the insulating element 60. A photo relay or a photo coupler having an insulation function is used as the insulating element 60.

The microcomputer 70 includes a CPU, ROM, EEPROM and RAM, not shown, to serve as a control circuit that monitors the operation states of the cells 11 according to a program stored such as in the ROM. The microcomputer 70 acquires a residual capacity (state of charge; SOC) of the battery pack 10. In acquiring the residual capacity, the microcomputer 70 uses the cell voltage of each of the cells 11 measured by the A/D converter 50 and a current passing through the battery pack 10 measured by a measurement circuit, not shown. Thus, the microcomputer 70 controls charge/discharge of the cells 11 using, for example, an equalization discharge circuit, not shown, based on the residual capacity.

Further, the microcomputer 70 monitors the operation state, i.e. the presence/absence of an operational failure (e.g., overcharge or overdischarge), of each cell 11 based on the cell voltage of the cell measured by the A/D converter 50. In the present embodiment, the microcomputer 70 carries out monitoring focusing on the operation states of two cells 11, i.e. the cell 11 having a highest cell voltage and the cell 11 having a lowest cell voltage, among the plurality of cells 11. Specifically, the microcomputer 70 once measures the cell voltages of all the cells 11, but then carries out monitoring focusing on the operation states of only the two cells 11, i.e. the cell 11 having a highest cell voltage and the cell 11 having a lowest cell voltage. In other words, the microcomputer 70 monitors the operation states of the two cells 11, i.e. the cell 11 having a highest cell voltage and the cell 11 having a lowest cell voltage, in preference to other cells 11.

The above is how the battery-state monitoring apparatus 20 and the battery-state monitoring system of the present embodiment are configured. The configuration of the battery-state monitoring apparatus 20 enables measurement of the cell voltages of all of the respective cells 11. Thus, the method of detecting the cell voltage corresponds to the method based on total-cell-voltage detection.

Figure 2:
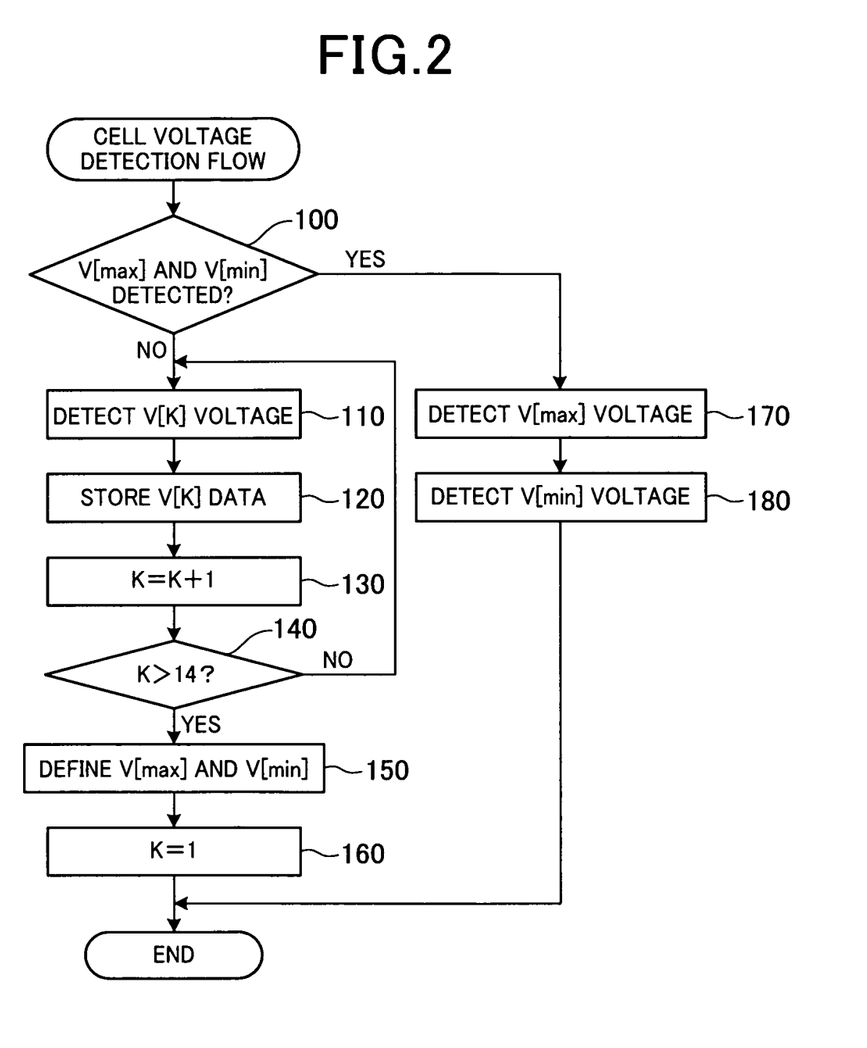
FIG. 2 is a flow diagram illustrating particulars in the detection of a maximum value and a minimum value of cells, which detection is performed by a microcomputer illustrated in FIG. 1.

Referring now to FIG. 2, hereinafter is described the operation of the battery-state monitoring apparatus 20 according to the present embodiment. FIG. 2 is a flow diagram illustrating particulars of cell voltage detection.

The cell 11 (V[max]) having a highest cell voltage and the cell 11 (V[min]) having a lowest cell voltage are detected on an occasion when the cell voltages are stable. For example, such an occasion corresponds to: (1) the time when ignition of the vehicle is turned on; (2) the time when the ignition is turned off; (3) the period when the ignition is turned off (intermittent operation); (4) a predetermined time interval in the period when the ignition is turned on (e.g., the period of waiting at the traffic light); or (5) the case where a relation, i.e. battery current<predetermined value, is established (e.g., the case where no current passes through the battery pack 10). If the operation states of all of the cells 11 are constantly monitored, the time taken for the monitoring will be long. Therefore, all of the cell voltages are measured only when a condition provided above is met.

First, when the flow diagram (cell voltage detection flow) illustrated in FIG. 2 is started, it is determined, at step 100, whether or not detection of the cell 13. (V[max]) having a highest cell voltage and the cell 11 (V[min]) having a lowest cell voltage has been completed. Specifically, it is determined whether the cell 11 having a highest cell voltage and the cell 11 having a lowest cell voltage have already been defined after the measurement of the cell voltages of all of the cells 11 at the cell voltage detection occasion as provided above.

If it is determined, at the present step, that the cell 11 having a highest cell voltage and the cell 11 having a lowest cell voltage have not yet been defined, control proceeds to step S110.

At step 110, the cell voltage of a $K^{th}$ cell 11 among the cells 11 is measured. As will be described later, since K has been set to 1 at the time point when the flow diagram shown in FIG. 2 is started, the cell voltage of a first cell 11 is measured.

Then, at step 120, the cell voltage of the cell 11 measured at step 110 is stored in a data storage of the microcomputer 70.

Subsequently, at step 130, calculation is carried out based on a relation K=K+1 to set the subsequent cell 11 as a target for measuring the cell voltage. If the target of measurement at step 110 is the first cell 11, the second cell 11 will be set at the present step as the target of measurement.

At step 140, it is determined whether or not a relation K>14 is satisfied. As mentioned above, the number of the cells 11 composing the battery pack 10 is fourteen. Therefore, if the value of K calculated at step 130 is 15, the $15^{th}$ cell 11 as a target of measurement is not present. Accordingly, at the present step, it is determined whether or not the cell voltages of all of the cells 11 have been measured.

If it is determined, at step 140, that the relation K>14 is not satisfied, i.e. if the cell voltages of not all of the cells 11 have been measured, control returns to step 110. Thus, steps 110 to 140 are repeatedly performed to measure the cell voltages of all of the cells 11. On the other hand, if the relation K>14 is determined to be satisfied at step 140, control proceeds to step 150.

At step 150, the cell 11 (V[max]) having a highest cell voltage and the cell 11 (V[min]) having a lowest cell voltage are defined from among the cell voltages stored in the data storage at step 120.

Then, at step 160, K is set to 1. Thus, when the flow diagram shown in FIG. 2 is started in the subsequent loop, the target of measurement is set to the first cell 11. Thus, the flow diagram shown in FIG. 2 is completed.

At step 100, if it is determined that detection of the cell 11 having a highest cell voltage and the cell 11 having a lowest cell voltage has already been completed, control proceeds to step 170. At step 170, the cell voltage of the moment is measured for the cell 11 having a highest cell voltage. Then, at step 180, the cell voltage of the moment is measured for the cell 11 having a lowest cell voltage. Thus, the flow diagram shown in FIG. 2 is completed.

In this way, the cell 11 having a highest cell voltage and the cell 11 having a lowest cell voltage are obtained from among the cells 11. Then, when the flow diagram shown in FIG. 2 is started again, it is determined, at step 100, that detection of the cells 11 has been completed. Then, at steps 170 and 180, the cell voltages of the target cells 11 for monitoring are measured.

Then, the microcomputer 70 monitors the cell 11 having a highest cell voltage and the cell 11 having a lowest cell voltage defined as described above, as to the presence/absence of a failure (i.e. operation states), based on the cell voltages measured at steps 170 and 180.

When the cells 11 are used in a vehicle, the cell voltage of each of the cells 11 fluctuates. In this regard, since the cell 11 having a highest cell voltage and the cell 11 having a lowest cell voltage are periodically detected at an occasion as provided above, target cells 11 for monitoring are periodically changed.

As described above, the present embodiment is characterized in that two target cells 11 for monitoring, i.e. the cell 11 having a highest cell voltage and the cell 11 having a lowest cell voltage, are defined from among the cells 11, and that the microcomputer 70 carries out monitoring of the operation states focusing on the two cells 11.

In this way, monitoring is carried out by restricting the cells 11 to two cells, i.e. the cell 11 having a highest cell voltage and the cell 11 having a lowest cell voltage, which are likely to cause a failure. Accordingly, it is not required that all of the cells 11 are constantly monitored. In other words, high-speed monitoring is realized for the cells 11 which are likely to cause a failure. In addition, since the cell voltages of the target cells 11 for monitoring are detected by the A/D converter 50, the operation states of the target cells 11 for monitoring can be monitored with good accuracy. Accordingly, the operation states of the cells 11 can be monitored faster with good precision.

Second Embodiment

Referring to FIGS. 3 to 6, hereinafter is described a battery-state monitoring apparatus according to a second embodiment.

In the present embodiment, differences from the first embodiment are described. In the second and the subsequent embodiments, components identical with or similar to the components described in the previous embodiment are given the same references to omit or simplify the description.

In the first embodiment described above, cell voltages have been detected using the method based on total-cell-voltage detection. In the present embodiment, however, the method based on total-cell-voltage detection is combined with the method based on comparators to ensure monitoring of the operation states of the cells 11.

Figure 3:
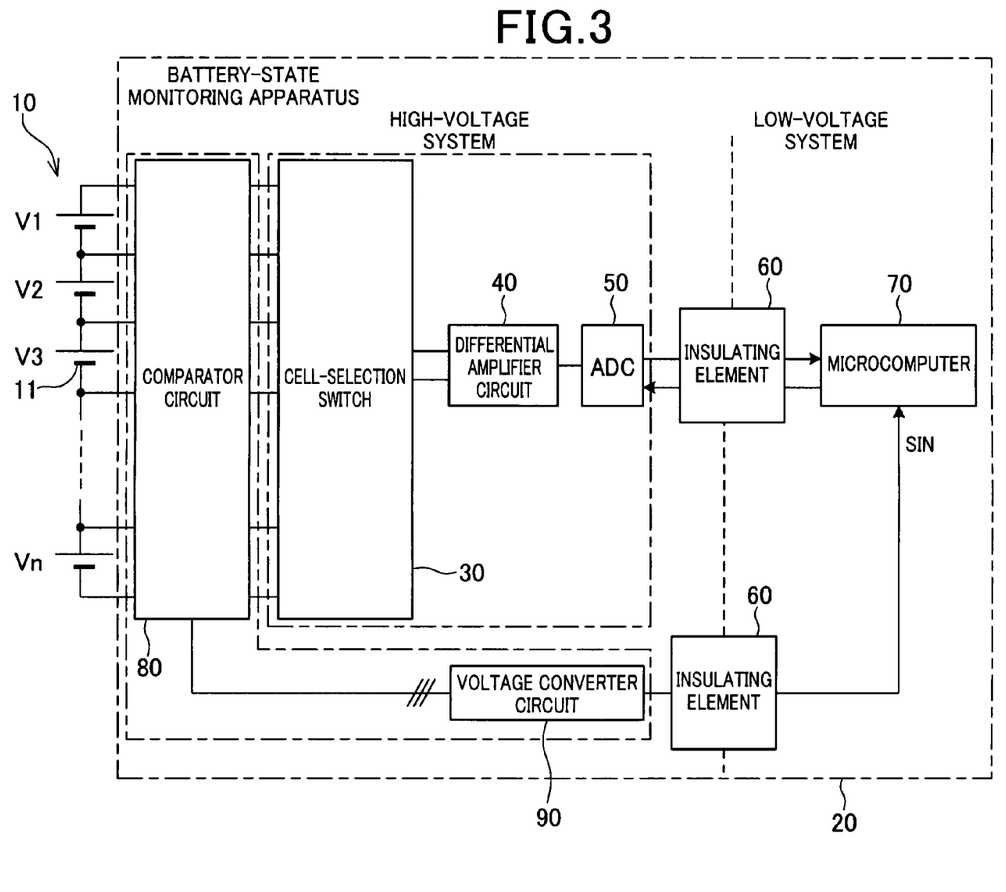
FIG. 3 is a schematic diagram illustrating a general configuration of a battery-state monitoring system including a battery-state monitoring apparatus according to a second embodiment and a fourth embodiment of the present invention.

FIG. 3 is a schematic diagram illustrating a battery-state monitoring system including a battery-cell monitoring apparatus 20 according to the present embodiment. As shown in FIG. 3, the battery-state monitoring apparatus 20 includes a comparator circuit 80, cell-selection switch 30, differential amplifier circuit 40, A/D converter 50, voltage converter circuit 90, insulating element 60 and microcomputer 70.

In the present embodiment, the battery pack 10 is composed of n cells 11 (V1 to Vn). In the configuration shown in FIG. 3, the cell-selection switch 30, the differential amplifier circuit 40 and the A/D converter 50 are the same as those described in the first embodiment.

Figure 4:
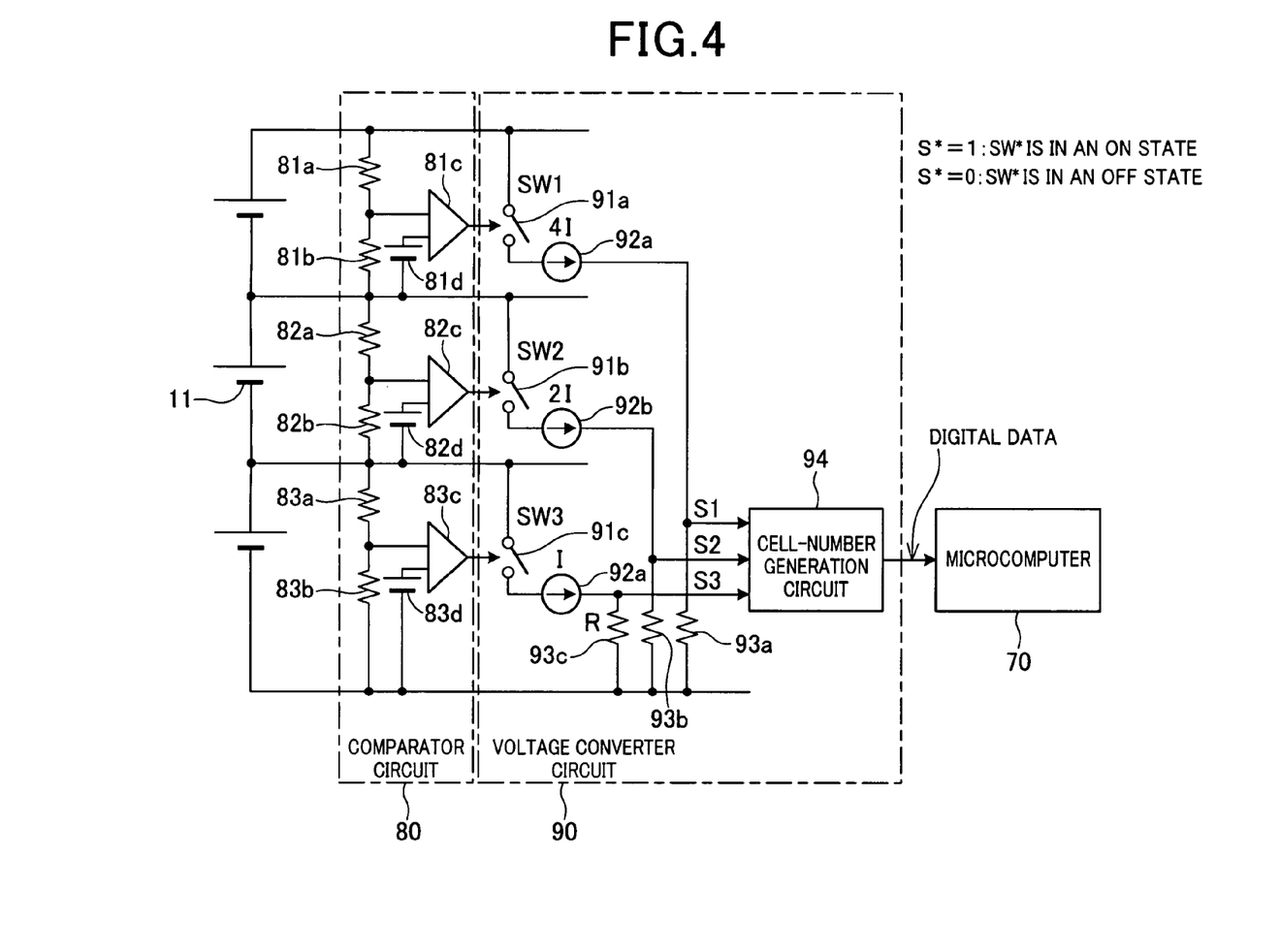
FIG. 4 is a diagram illustrating a specific configuration of a comparator circuit and a voltage converter circuit illustrated in FIG. 3.

The comparator circuit 80 serves as a comparison circuit that determines whether the voltage of each cell 11 is larger or smaller than a predetermined threshold. FIG. 4 is a diagram illustrating specific circuit configurations of the comparator circuit 80 and the voltage converter circuit 90. As shown in the figure, the comparator circuit 80 includes, for individual cells 11, resistors 81a to 83a, resistors 81b to 83b, reference supplies 81d, 82d and 83d, and comparators 81c, 82c and 83c. FIG. 4 shows a configuration of the comparator circuit 80 in the case where the number of the cells 11 is three. Further, in FIG. 4, the insulating element 60 is omitted.

The resistors 81a to 83a and the resistors 81b and 83b are connected in series between the positive side and the negative side of the respective cells 11. For example, a point between the resistor 81a and the resistor 81b is connected to one of input terminals of the comparator 81c. In other words, the comparator 81c is applied with a partial voltage of the cell 11 via the resistor 81a and the resistor 81b. The same applies to the connecting relationship between the resistor 82a, the resistor 82b and the comparator 82c, as well as the connecting relationship between the resistor 83a, the resistor 83b and the comparator 83c.

The respective reference supplies 81d, 82d and 83d generate a predetermined threshold. The reference supplies 81d, 82d and 83d are each connected between the other of the input terminals of each of the respective comparators 81c, 82c and 83c and the negative side of the corresponding cell 11.

In the present embodiment, the predetermined threshold is set to a value that falls within a normally used voltage range of the plurality of cells 11. Usually, the cell voltage of each cell 11 fluctuates within the normally used voltage range. Thus, the cell voltages of the cells 11 can be adapted to cross the predetermined threshold. The predetermined threshold is set to a single value. Thus, the cell 11 having a cell voltage higher than the predetermined threshold or the cell 11 having a cell voltage lower than the predetermined threshold is ensured to be detected. Accordingly, the configuration of the battery-state apparatus is simplified.

The comparators 81c, 82c and 83c each serves as a comparing means that compares the cell voltage of each of the respective cells 11 with the predetermined threshold. Practically, the comparators 81d to 83d each compare the partial voltage provided via each of the respective resistors 81a to 83a and each of the respective resistors 81b to 83b with the predetermined threshold.

For example, when the cell voltage of each cell 11 is 4 V, the predetermined threshold is set to 3.6 V (=SOC 60%, center of control). The cell voltages of all of the cells 11 are not all the same, but they are slightly different from each other. Therefore, when the cell voltages increase, the cell 11 whose cell voltage has exceeded the predetermined threshold first is diagnosed as having a highest cell voltage. Similarly, the cell 11 whose cell voltage has exceeded the predetermined threshold last is diagnosed as having a lowest cell voltage. Further, when the cell voltages decrease, the cell 11 whose cell voltage has reduced below the predetermined threshold first is diagnosed as having a lowest cell voltage. Similarly, the cell 11 whose cell voltage has reduced below the predetermined threshold last is diagnosed as having a highest cell voltage.

Each of the comparators 81c, 82c and 83c is ensured to output a high-level signal (hereinafter referred to as "HIGH signal") when the cell voltage of the corresponding cell 11 has exceeded the predetermined threshold, and to output a low-level signal (hereinafter referred to as "LOW signal") when the cell voltage of the cell 11 has gone below the predetermined threshold. The outputs of the comparators 81c, 82c and 83c are inputted to the voltage converter circuit 90.

As shown in FIG. 4, the voltage converter circuit 90 includes a plurality of switches 91a to 91c (SW1, SW2 and SW3), a plurality of constant current sources 92a to 92c (4I, 2I and I), a plurality of resistors 93a to 93c (R) and a cell-number generation circuit 94. Of these components, the switches 91a to 91c, the constant current sources 92a to 92c and the resistors 93a to 93c are provided for the respective cells 11.

The switches 91a to 91c, which serve as switching means, are provided for the respective comparators 81c, 82c and 83c and turn to an ON/OFF state according to the outputs of the respective comparators 81c, 82c and 83c. One contact point of each of the switches 91a to 91c is connected to the positive side of each of the respective cells 11, while the other contact point thereof is connected to each of the respective constant current sources 92a to 92c. For example, the switches 91a to 91c turn to an ON state when the outputs of the respective comparators 81c, 82c and 83c are HIGH signals, and turn to an OFF state when the outputs of the comparators 81c, 82c and 83c are LOW signals. Transistors or the like are used as the switches 91a to 91c.

The constant current sources 92a to 92c are ensured to pass constant current. The constant current source 92a is connected to the other contact point of the switch 91a. The constant current source 92b is connected to the other contact point of the switch 91b. The constant current source 92c is connected to the other contact point of the switch 91c. In the present embodiment, current of 4I is set to pass through the constant current source 92a. Further, current of 2I is set to pass through the constant current source 92b, and current of I is set to pass through the constant current source 92c.

The resistors 93a to 93c are connected between the respective constant current sources 92a to 92c and the negative side of the cell 11 on the lowest voltage side. The resistances of the resistors 93a to 93c are each set to R. Connecting points (S1 to S3) between the constant current sources 92a to 92c and the respective resistors 93a to 93c are connected to the cell-number generation circuit 94. Thus, when the switch 91a (SW1) is in an ON state, the connecting point (S1) between the constant current source 92a and the resistor 93a is applied with a voltage indicative of 1. When the switch 92a (SW1) is in an OFF state, the connecting point (S1) between the constant current source 92a and the resistor 93a is applied with a voltage indicative of 0. The same applies to the output of the contact point (S2) between the constant current source 92b and the resistor 93b associated with the switch 91b, and to the connecting point (S3) between the constant current source 92c and the resistor 93c associated with the switch 91c.

The cell-number generation circuit 94 serves as a circuit for generating digital data, based on the voltages that have been inputted from the connecting points (S1 to S3) in response to the states of the switches 91a to 91c. The digital data includes information (cell number) regarding which cells 11 are normal and which cells 11 have failures. The digital data generated by the cell-number generation circuit 94 is outputted to the microcomputer 70 as SIN signals.

The insulating element 60 serves as an element that insulate the high-voltage system composed such as of the comparator circuit 80, cell-selection switch 30, differential amplifier circuit 40, A/D converter 50 and voltage converter circuit 90, from the low-voltage system composed such as of the microcomputer 70. In the present embodiment, the A/D converter 50 is connected to the microcomputer 70 via a single insulating element 60, while the voltage converter circuit 90 is connected to the microcomputer 70 via a single insulating element 60. A photo relay or a photo coupler having an insulation function is used as the insulating element 60.

The microcomputer 70 monitors the operation states of the cell 11 having a highest cell voltage and the cell 11 having a lowest cell voltage, which cells 11 have been detected by the comparator circuit 80.

The above is the configuration of the battery-state monitoring apparatus 20 and the battery-state monitoring system according to the present embodiment. The battery-state monitoring apparatus 20 has a configuration in which the method based on total-cell-voltage detection that enables measurement of the cell voltages of all the cells 11 is combined with the method based on comparators that compares the cell voltage of each of the cells 11 with a predetermined threshold.

Figure 5:
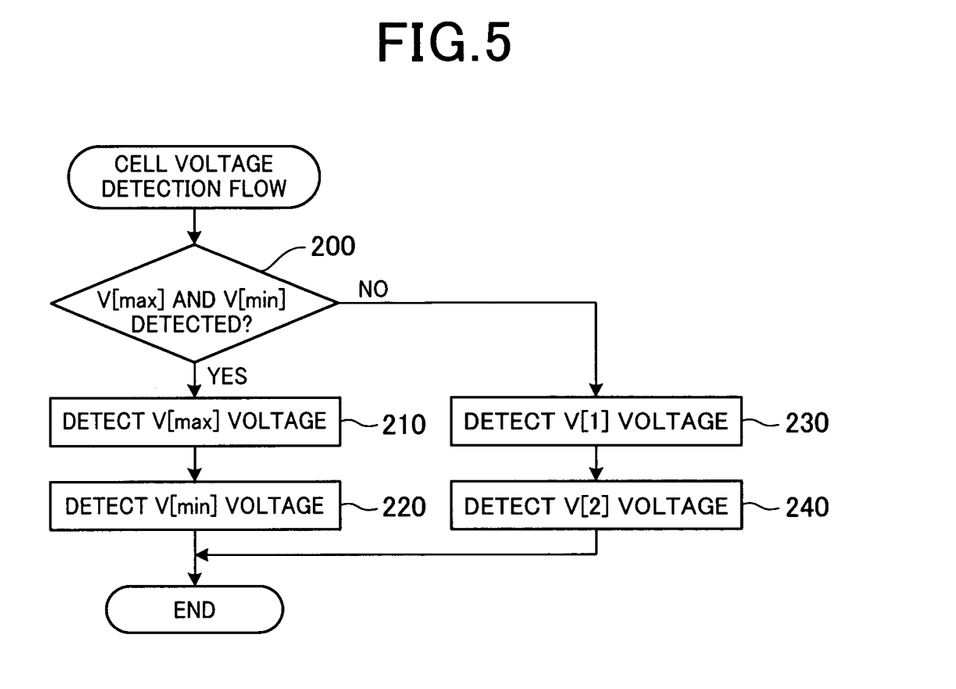
FIG. 5 is a flow diagram illustrating particulars in the detection of cell voltages.
Figure 6:
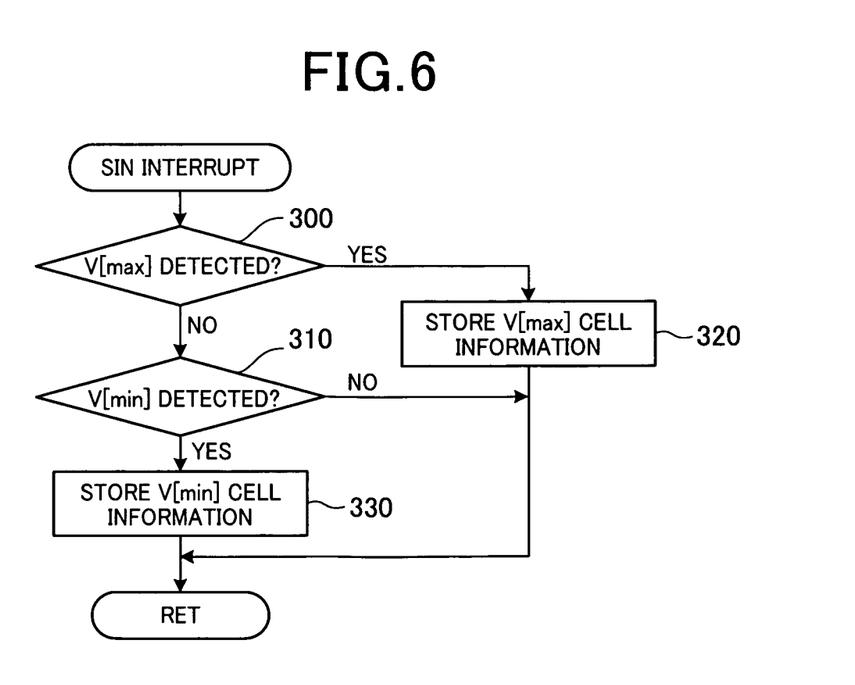
FIG. 6 is a flow diagram illustrating processing of interrupt with a SIN signal from the voltage converter circuit to the microcomputer, according to the second embodiment.

Referring now to FIGS. 5 and 6, hereinafter is described the operation of the battery-state monitoring apparatus 20 according to the present embodiment. FIG. 5 is a flow diagram illustrating particulars of cell voltage detection. FIG. 6 is a flow diagram illustrating processing of interrupt with a SIN signal from the voltage converter circuit 90 to the microcomputer 70. It should be appreciated that the timing of starting the flow diagram of FIG. 5 is the same as that of the first embodiment.

First, upon start of the flow diagram (cell voltage detection flow) of FIG. 5, it is determined, at step 200, whether or not detection of the cell 11 (V[max]) having a highest cell voltage and the cell 11 (V[min]) having a lowest cell voltage has been completed.

If it is determined, at the present step, that the cell 11 having a highest cell voltage and the cell 11 having a lowest cell voltage have already been defined, control proceeds to step 210.

At step 210, the cell voltage of the moment is measured for the cell 13 having a highest cell voltage. Subsequently, at step 220, the cell voltage of the moment is measured for the cell 11 having a lowest cell voltage. Thus, the flow diagram shown in FIG. 5 is completed.

At step 200, if it is determined that detection of the cell voltage of the cell 11 having a highest cell voltage and the cell 11 having a lowest cell voltage has not been completed, control proceeds to steps 230 and 240. At steps 230 and 240, the cell voltages (e.g., V[1] and V[2]) of the respective cells 11 are each diagnosed by the comparator circuit 80 to detect the cell 11 having a highest cell voltage and the cell 11 having a lowest cell voltage. Although steps 230 and 240 indicate steps dealing with two cells 11, practically, all of the cells 11 are diagnosed.

When the flow diagram of FIG. 5 is started again, it is determined, at step 200, that detection of the cell 11 having a highest cell voltage and the cell 11 having a lowest cell voltage has been completed and thus control proceeds to steps 210 and 220. At steps 210 and 220, the cell voltages of the target cells 11 for monitoring are measured.

The microcomputer 70 monitors the two cells 11, i.e. the cell 11 having a highest cell voltage and the cell 11 having a lowest cell voltage, which have been located as described above, as to the presence/absence (operation states) of a failure, based on the cell voltages measured at steps 210 and 220. Measurement of the cell voltages is constantly performed so that the microcomputer 70 can constantly monitor the operation states of the target cells 11 for monitoring.

On the other hand, the comparator circuit 80 constantly compares the cell voltage of each cell 11 with a predetermined threshold. The results of the comparison are inputted to the microcomputer 70 via the voltage converter circuit 90. Specifically, the cell 11 having a highest cell voltage and the cell 11 having a lowest cell voltage are updated. Referring to FIG. 6, such interrupt processing is described.

First, at step 300, upon input of a SIN signal from the voltage converter circuit 90 to the microcomputer 70, it is determined, based on the SIN signal, whether or not a new cell 11 (V[max]) having a highest cell voltage has been detected.

If it is determined, at the present step, that the SIN signal does not include information regarding a new cell 11 having a highest cell voltage, control proceeds to step 310.

At step 310, similar to step 300, it is determined whether or not a new cell 11 (V[min]) having a lowest cell voltage has been detected. If it is determined, at the present step, that the SIN signal does not include information regarding a new cell 11 having a lowest cell voltage, control again returns to step 300 in the flow diagram shown in FIG. 6. Unless the comparator circuit 80 detects a new cell 11 having a highest cell voltage and a new cell 11 having a lowest cell voltage, steps 300 and 310 are repeatedly performed.

On the other hand, if it is determined, at step 300, that the information regarding a new cell 11 having a highest cell voltage has been included, control proceeds to step 320. At step 320, the cell number of the cell 11 in question is stored in the data storage. Further, if it is determined, at step 310, that the information regarding a new cell 11 having a lowest cell voltage has been included, control proceeds to step 330. At step 330, the cell number of the cell 11 in question is stored in the data storage.

In this way, the cell numbers of the cell 11 having a highest cell voltage and the cell 11 having a lowest cell voltage are constantly updated through the interrupt processing. Then, the microcomputer 70 constantly monitors the presence/absence of a failure by measuring the cell voltages of the cells 11 having the cell numbers stored in the data storage.

As described so far, the present embodiment uses not only the method based on total-cell-voltage detection but also the method based on comparators for diagnosing the cell voltages. Therefore, cell voltage can be independently diagnosed for each of the cells 11. Further, the diagnosis can be concurrently performed for the individual cells 11. In addition, the concurrent diagnosis of the individual cells 11 enables high-speed diagnosis.

Third Embodiment

Figure 7A:
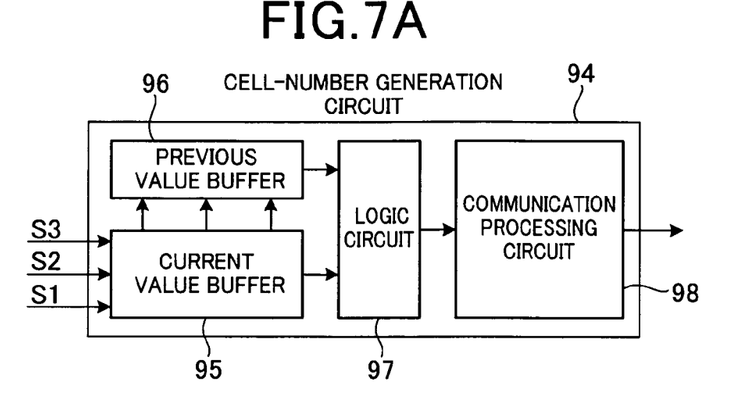
FIG. 7A is a schematic diagram illustrating a cell-number generation circuit in a battery-state monitoring apparatus according to a third embodiment of the present invention.
Figure 7B:
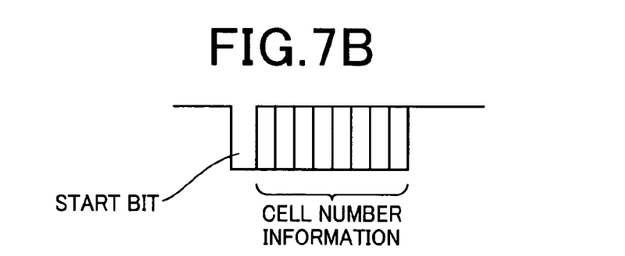
FIG. 7B is a diagram illustrating an example of the SIN signal outputted from the cell-number generation circuit.

Referring to FIGS. 7A and 7B as well as FIG. 8, hereinafter is described a battery-state monitoring apparatus according to a second embodiment. In the present embodiment, description will be given focusing on the differences from the second embodiment.

FIG. 7A is a schematic diagram illustrating a cell-number generation circuit 94 according to the present embodiment. FIG. 7B is a diagram illustrating an example of a SIN signal outputted from the cell-number generation circuit 94.

In the present embodiment, the cell-number generation circuit 94 is ensured to define the cell 11 having a highest cell voltage or the cell 11 having a lowest cell voltage from among the cells 11, based on the outputs from the comparators 81c, 82c and 83c. After that, the cell-number generation circuit 94 is ensured to output data that includes the information (cell-number information) for locating the defined cell voltage 11 to the microcomputer 70. Accordingly, as shown in FIG. 7A, the cell-number generation circuit 94 includes a current-value buffer 95, previous-value buffer 96, logic circuit 97 and communication processing circuit 98.

The current-value buffer 95 and the previous-value buffer 96 each serve as storing means for temporarily storing the information from the connecting points (S1 to S3) of the voltage converter circuit 90. The latest information from the connecting points (S1 to S3) of the voltage converter circuit 90 is stored in the current-value buffer 96.

The logic circuit 97 serves as a circuit for determining whether or not communication processing should be executed, based on the data stored in the current-value buffer 95 and the previous-value buffer 96. The communication processing circuit 98 is a so-called interface and thus outputs, as shown in FIG. 7B, an eight-bit SIN signal with a start bit that is the information regarding a cell number.

Figure 8:
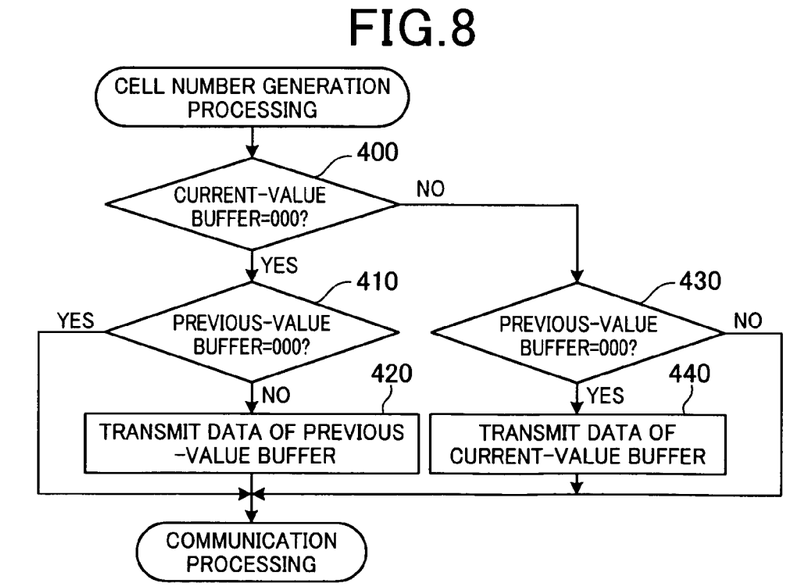
FIG. 8 is a flow diagram illustrating particulars in cell-number generation processing.

Referring to FIG. 8, hereinafter is described cell-number generation processing performed in the cell-number generation circuit 94. FIG. 8 is a flow diagram illustrating particulars of the cell-number generation processing performed in the cell-number generation circuit 94.

The description here is given for the case where there are three cells 11 and the cell-number generation processing is executed when the cell voltages are increasing. The states of the connecting points (S1 to S3) are indicated by "(S1, S2 and S3)".

First, at step 400, it is determined whether or not the data stored in the current-value buffer 95 is (000). Specifically, it is determined whether or not any of the cell voltages of the cells 11 has exceeded a predetermined threshold. If the data stored in the current-value buffer 95 is determined, at the present step, to be (000), control proceeds to step 410.

Then, at step 410, it is determined whether or not the data stored in the previous-value buffer 96 is (000). If the data stored in the previous-value buffer 96 is determined, at the present step, to be (000), the flow diagram shown in FIG. 8 is terminated. In this case, there is no change in the cell 11 having a highest cell voltage and the cell 11 having a lowest cell voltage. Accordingly, no signal is outputted from the communication processing circuit 98.

If the previous-value buffer 96 determines, at step 410, that the data is not (000), control proceeds to step 420. This means that the data in the previous-value buffer 96 is not (000), that the data stored in the current-value buffer 95 is (000), and that there are no longer the cells 11 having a cell voltage exceeding the predetermined threshold. In this case, the target cells 11 for monitoring are not changed but, at step 420, transmission of the data stored in the previous-value buffer 96 is determined. Then, the flow diagram shown in FIG. 8 is terminated. Thus, a SIN signal including the same cell number information as the previous is outputted from the communication processing circuit 98.

On the other hand, at step 400, if the data in the current-value buffer 95 is not (000), control proceeds to step 430. At step 430, it is determined whether or not the data stored in the previous-value buffer 96 is (000). If it is determined, at the present step, that the data in the previous-value buffer 96 is not (000), any of the cells 11 maintains a state where the cell voltage exceeds the predetermined threshold. In this case, the flow diagram shown in FIG. 8 is terminated. Thus, in order to reduce the frequency of interrupt, no signal is outputted from the communication processing circuit 98.

At step 430, if the data in the previous-value buffer 96 is (000), the data in the current-value buffer 96 is not (000). Thus, any of the cells 11 is in a state where the cell voltage has firstly exceeded the predetermined threshold. In this case, control proceeds to step 440 where transmission of the data stored in the current-value buffer 95 is determined. Then, the flow diagram shown in FIG. 8 is terminated and thus a SIN signal including information of the cell number for which a new failure has been detected current is outputted from the communication processing circuit 98.

As described above, an interrupt with a SIN signal is caused to the microcomputer 70 only when the state of a single cell 11 has changed during the increase of the cell voltage, i.e. only when control has proceeded to step 440. After that, irrespective of the change in the state of a second cell 11, no interrupt is caused to the microcomputer 70 so that the frequency of interrupt with a SIN signal will not become high. Thus, the processing load of the microcomputer 70 is mitigated.

The description provided above has dealt with the case where the cell voltage is increasing. Similar to this, in the case where the cell voltage is decreasing as well, an interrupt with a SIN signal may be caused to the microcomputer 70 only when the state of a cell 11 has initially changed.

Fourth Embodiment

Extensively using FIGS. 3 and 4, hereinafter is described a battery-state monitoring apparatus according to a fourth embodiment.

In the present embodiment, description is given focusing on the differences from the second and the third embodiments.

The present embodiment provides an apparatus in which two predetermined thresholds are set in the comparator circuit 80. In the present embodiment as well, the predetermined thresholds are set to values that fall within the normally used voltage range.

For example, when the cell voltage of each cell 11 is 4 V, one value of the predetermined thresholds (lower limit) is set to 3.4 V (=SOC 40%, lower limit of control) and the other value thereof (upper limit) is set to 3.8 V (=SOC 80%, upper limit of control). Thus, the cell 11 whose cell voltage has just exceeded the other value (upper limit) of the predetermined thresholds is diagnosed as being the cell 11 having a highest cell voltage, and the cell 11 whose cell voltage has just fallen below the one value (lower limit) of the predetermined thresholds is diagnosed as being the cell 11 having a lowest cell voltage.

Accordingly, each of the comparators 81*d* to 83*d* outputs a HIGH signal when the cell voltage of the corresponding cell 11 has firstly exceeded the other value (upper limit) of the predetermined thresholds, so and outputs a LOW signal when the cell voltage of the corresponding cell 11 has firstly lowered the one value (lower limit) of the predetermined thresholds. The outputs of the individual comparators 81*d* to 83*d* are inputted to the voltage converter circuit 90.

As described above, two predetermined thresholds are set in the comparator circuit 80, the predetermined thresholds falling within the normally used voltage range. This provides a merit of reducing the frequency of causing an interrupt with a SIN signal to the microcomputer 70. Further, the other value of the predetermined thresholds can also be used for determining an upper limit of control. In other words, once an interrupt is caused, system control, such as failure processing or power saving, can be performed.

Fifth Embodiment

Extensively using FIGS. 1 and 3, hereinafter is described a battery-state monitoring apparatus according to a fifth embodiment.

In the present embodiment, description is given focusing on the differences from the first to the fourth embodiments.

As described above, in the configuration of the battery-state monitoring apparatus 20 shown in FIG. 1 and/or FIG. 2, the microcomputer 70 measures the cell voltage of each of the cells 11 composing the battery pack 10 and the current passing through the battery pack 10 in order to acquire a residual capacity SOC of the battery pack 10.

In the present embodiment, the microcomputer 70 acquires an internal resistance of each cell 11 based on the cell voltage of the cell 11 and the current passing through the battery pack 10. Then, the microcomputer 70 monitors the presence/absence of a failure for the cells 11 whose acquired internal resistance is equal to or more than a predetermined value.

Thus, the microcomputer 70 is able to monitor not only the operation states of the two cells 11, i.e. the cell 11 having a highest cell voltage and the cell 11 having a lowest cell voltage, but also the operation states of the cells 11 each having a high internal resistance and thus having a probability of being suffering from deterioration.

Other Embodiments

The configurations of the battery-state monitoring apparatus 20 set forth in the above embodiments are only some examples. The present invention is not limited to the configurations set forth above, but may have other configurations having the characteristics of the present invention. For example, in the embodiments described above, a single comparator circuit 80 or voltage converter circuit 90 has been provided for all of the cells 11 composing the battery pack 10. Alternative to this, the plurality of cells 11 composing the battery pack 10 may be divided into a predetermined number of blocks and each of the blocks may be provided with a single comparator circuit 80 or voltage converter circuit 90.

Further, in the embodiments described above, the battery-state monitoring apparatus 20 has been applied to an electric vehicle, such as a hybrid vehicle. This, however, is only an example of an application of the battery-state monitoring apparatus 20. The battery-state monitoring apparatus 20 may be applied to the case where the operation states of the cells 11 installed in a system other than a vehicle are monitored using the cell voltages.

In the embodiments described above, the predetermined threshold has been set to a value that falls within a normally used voltage range. However, this is only an example. The predetermined threshold may be set to a value out of the normally used voltage range of the cells 11.

In the fourth embodiment described above, two predetermined thresholds have been used. Alternatively, however, three or more predetermined thresholds may be used. Thus, monitoring may be performed regarding not only the overcharge and overdischarge of each cell 11 but also the operation states of the cells 11 to which attention is required to be paid for other reasons. Further, the microcomputer 70 may be adapted to charge or discharge each of the cells 11 by a predetermined amount, followed by starting monitoring of the operation states of the cells 11. Thus, each cell 11 will have a value equal to or more than the predetermined threshold or a value equal to or less than the predetermined threshold. In this way, reliable diagnosis can be conducted of the cells 11.

In the fifth embodiment described above, the cell voltage of each cell 11 has been compared with a predetermined threshold. Based on the comparison, monitoring has been carried out for both of the operation states of the two cells 11, i.e. the cell 11 having a highest cell voltage and the cell 11 having a lowest cell voltage, and the operation states of the cells 11 whose internal resistance is equal to or more than a predetermined value. Alternative to this, however, the microcomputer 70 may monitor only the operation states of the cells 11 whose internal resistance is equal to or more than a predetermined value.

What is claimed is:
1. An apparatus for monitoring an operation state of a battery comprising:

detecting means for detecting a cell voltage of each of the a plurality of cells, the plurality of cells being electrically connected in series so as to compose the battery; and monitoring means for monitoring an operation state of cells to be monitored among the plurality of cells, the cells to be monitored being composed of a cell having a highest cell voltage and a cell having a lowest cell voltage;

wherein the detecting means includes:
  a plurality of comparators provided for the plurality of cells respectively, each of the comparators comparing a cell voltage of a corresponding one of the cells with a predetermined threshold provided to each of the comparators; and
  deciding means for deciding, among the cells, a cell having the highest cell voltage and a cell having the lowest voltage, based on results compared by the comparators, wherein the monitoring means includes:
  updating means for updating the cells having the highest and lowest cell voltages and being monitored by the monitoring means, with the cells having the highest and lowest cell voltages and being decided by the deciding means, respectively.

2. The battery-state monitoring apparatus according to claim 1, wherein the predetermined threshold is set to a value that falls within a normally used voltage range of the plurality of cells.

3. The battery-state monitoring apparatus according to claim 1, wherein two or more values are provided as the predetermined threshold.

4. The battery-state monitoring apparatus according to claim 1, wherein a single value is provided as the predetermined threshold.

5. The battery-state monitoring apparatus according to claim 4, further comprising a cell-number generation circuit that receives information showing the cells having the highest and lowest cell voltages and being decided by the deciding means and output data showing the cell having the highest cell voltage or the cell having the lowest cell voltage to the updating means.

6. The battery-state monitoring apparatus according to claim 4, further comprising means for performing charge or discharge of a predetermined amount for the plurality of cells,
  wherein the monitoring means is configured to start monitoring of the operation state of the cells to be monitored.

7. The battery-state monitoring apparatus according to claim 5, further comprising means for performing charge or discharge of a predetermined amount for the plurality of cells,
  wherein the monitoring means is configured to start monitoring of the operation state of the cells to be monitored.

8. An apparatus for monitoring an operation state of a battery including a plurality of cells which are electrically connected in series so as to compose the battery, the apparatus comprising:
  a plurality of comparators provided for the plurality of cells respectively, each of the comparators being configured to compare a detected cell voltage of a corresponding one of the cells with a predetermined threshold provided to each of the comparators to determine the cell having the highest cell voltage and the cell having the lowest voltage; and
  a computer configured to:
    monitor the operation states of the cell having the highest cell voltage and the cell having the lowest cell voltage rather than other cells of the battery; and
    respectively update the cell having the highest or lowest cell voltage being monitored by the computer with at least one new cell having a highest or lowest cell voltage based on received information regarding the new cell having the highest or lowest cell voltage as determined by the plurality of comparators.

9. The apparatus according to claim 8, wherein the predetermined threshold is set to a value that falls within a normally used voltage range of the plurality of cells.

10. The apparatus according to claim 8, wherein two or more values are provided as the predetermined threshold.

11. The apparatus according to claim 8, wherein a single value is provided as the predetermined threshold.

12. The apparatus according to claim 11, further comprising a cell-number generator configured to receive information showing the cells having the highest and lowest cell voltages resulting from the determination of the plurality of comparators and provide data showing the cell having the highest cell voltage or the cell having the lowest cell voltage for use by the computer.

13. The apparatus according to claim 11, wherein the computer is further configured to perform charge or discharge of a predetermined amount for the plurality of cells and then to start monitoring of the operation states of the cell having the highest cell voltage and the cell having the lowest cell voltage.

* * * * *